US009975815B2

(12) United States Patent
Steibel

(10) Patent No.: US 9,975,815 B2
(45) Date of Patent: May 22, 2018

(54) METHODS FOR FORMING CERAMIC MATRIX COMPOSITE ARTICLES

(71) Applicant: GENERAL ELECTRIC COMPANY, Schenectady, NY (US)

(72) Inventor: James Dale Steibel, Mason, OH (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 407 days.

(21) Appl. No.: 14/632,333

(22) Filed: Feb. 26, 2015

(65) Prior Publication Data

US 2016/0251270 A1 Sep. 1, 2016

(51) Int. Cl.
*C23C 16/30* (2006.01)
*C04B 35/80* (2006.01)
(Continued)

(52) U.S. Cl.
CPC ............ *C04B 35/806* (2013.01); *B05D 3/108* (2013.01); *B32B 5/024* (2013.01); *B32B 5/18* (2013.01); *B32B 7/02* (2013.01); *C04B 35/573* (2013.01); *C23C 16/0227* (2013.01); *C23C 16/045* (2013.01); *B32B 2262/105* (2013.01); *B32B 2305/076* (2013.01); *B32B 2603/00* (2013.01); *C04B 2235/3826* (2013.01); *C04B 2235/422* (2013.01); *C04B 2235/428* (2013.01); *C04B 2235/5244* (2013.01); *C04B 2235/5268* (2013.01); *C04B 2235/614* (2013.01); *C04B 2235/616* (2013.01); *C04B 2235/721* (2013.01);
(Continued)

(58) Field of Classification Search
CPC .... C23C 16/30; C23C 16/325; C23C 14/0635
See application file for complete search history.

(56) References Cited

U.S. PATENT DOCUMENTS

| 4,921,405 A | 5/1990 | Wilson |
| 5,486,379 A | 1/1996 | Bouillon et al. |

(Continued)

FOREIGN PATENT DOCUMENTS

| CN | 104507676 A | 4/2015 |
| EP | 0798280 A2 | 10/1997 |

(Continued)

OTHER PUBLICATIONS

Kim et al., "Nicalon-Fibre-Reinforced Silicon—Carbide Composites via Polymer Solution Infiltration and Chemical Vapour Infiltration", Journal of Materials Science, vol. No. 28, Issue No. 14, pp. 3866-3868, Jul. 15, 1993.

(Continued)

*Primary Examiner* — Bret P Chen
(74) *Attorney, Agent, or Firm* — John P. Darling

(57) ABSTRACT

A method for forming a ceramic matrix composite article includes forming a ceramic matrix composite substrate comprising a ceramic fiber reinforcement material in a ceramic matrix material having a first free silicon proportion by melt infiltration; forming a ceramic matrix composite outer layer comprising a ceramic fiber reinforcement material in a ceramic matrix material having a second free silicon proportion by melt infiltration or polymer impregnation pyrolysis disposed on at least a portion of the substrate. The second free silicon proportion being less than the first free silicon proportion.

15 Claims, 6 Drawing Sheets

(51) Int. Cl.

| | | |
|---|---|---|
| *C04B 35/573* | (2006.01) |
| *B32B 5/02* | (2006.01) |
| *B32B 7/02* | (2006.01) |
| *C23C 16/02* | (2006.01) |
| *C23C 16/04* | (2006.01) |
| *B05D 3/10* | (2006.01) |
| *B32B 5/18* | (2006.01) |

(52) U.S. Cl.
CPC .... *C04B 2235/728* (2013.01); *C04B 2235/96* (2013.01); *C04B 2235/9607* (2013.01)

(56) References Cited

U.S. PATENT DOCUMENTS

| | | | |
|---|---|---|---|
| 5,846,054 | A | 12/1998 | Mannava et al. |
| 6,221,475 | B1 | 4/2001 | Domergue et al. |
| 6,723,382 | B2 | 4/2004 | Yamaguchi et al. |
| 6,733,907 | B2 | 5/2004 | Morrison et al. |
| 7,378,362 | B2 | 5/2008 | Nixon et al. |
| 7,687,016 | B1 | 3/2010 | DiCarlo et al. |
| 7,708,851 | B2 | 5/2010 | Corman et al. |
| 8,043,720 | B2 | 10/2011 | Corman et al. |
| 8,426,326 | B2 | 4/2013 | Bouillon et al. |
| 8,529,995 | B2 | 9/2013 | Eberling-Fux et al. |
| 2005/0084379 | A1 | 4/2005 | Schreiber |
| 2006/0163773 | A1 | 7/2006 | Gray |
| 2007/0092762 | A1* | 4/2007 | Corman ............... C04B 35/573 428/701 |
| 2009/0016890 | A1 | 1/2009 | Douguet et al. |
| 2010/0021290 | A1* | 1/2010 | Schaff .................. F01D 5/147 415/200 |
| 2010/0021713 | A1 | 1/2010 | Lane et al. |
| 2011/0229337 | A1 | 9/2011 | Carper et al. |
| 2012/0076927 | A1 | 3/2012 | Bhatt et al. |
| 2013/0004325 | A1 | 1/2013 | McCaffrey et al. |
| 2013/0167374 | A1 | 7/2013 | Kirby et al. |
| 2015/0140256 | A1 | 5/2015 | Valle |
| 2016/0251269 | A1* | 9/2016 | Luthra ..................... B32B 7/02 428/212 |

FOREIGN PATENT DOCUMENTS

| | | |
|---|---|---|
| EP | 2248786 A1 | 11/2010 |
| JP | 11030103 A | 2/1999 |
| WO | 2014011242 A2 | 1/2014 |
| WO | 2014138108 A1 | 9/2014 |
| WO | 2014143364 A2 | 9/2014 |

OTHER PUBLICATIONS

Xu et al., "Carbon/Silicon Carbide Composites Prepared by Chemical Vapor Infiltration Combined with Silicon Melt Infiltration", Carbon Elsevier, vol. No. 37, Issue No. 8, pp. 1179-1187, Jan. 1, 1999.

Fan et al., "Microstructure and Properties of 3D Needle-Punched Carbon/Silicon Carbide Brake Materials", Composites Science and Technology, vol. No. 67, Issues No. 11-12, pp. 2390-2398, Sep. 2007.

European Search Report and Opinion issued in connection with related EP Application No. 16155969.5 dated Jul. 15, 2016.

European Search Report issued in connection with corresponding EP Application No. 16157183.1 dated Jul. 18, 2016.

International Search Report for PCT/US2013/078187 dated Oct. 7, 2014, published as WO 2014/143364 A3, 4 pages.

Luthra; "Recession Resistant Ceramic Matrix Composites and Environmental Barrier Coatings," Pending U.S. Appl. No. 13/834,350, filed Mar. 15, 2013.

Luthra et al.; "Ceramic Matrix Composite Articles and Methods for Forming Same," Pending U.S. Appl. No. 14/632,030, filed Feb. 26, 2015.

Machine translation and Chinese Office Action issued in connection with corresponding CN Application No. 201610106271.4 dated Feb. 9, 2018.

* cited by examiner

METHODS FOR FORMING CERAMIC MATRIX COMPOSITE ARTICLES

CROSS-REFERENCE TO RELATED APPLICATION

This application is related to commonly assigned, co-filed patent application Ser. No. 14/632,030, filed Feb. 26, 2015, by Luthra et al. and entitled "Ceramic Matrix Composite Articles And Methods For Forming Same", which is hereby incorporated herein in its entirety by reference.

TECHNICAL FIELD

The present disclosure generally relates to ceramic matrix composites (CMC), and more particularly, to articles and methods for forming ceramic matrix composite articles.

BACKGROUND

Ceramic matrix composites generally include a ceramic fiber reinforcement material embedded in a ceramic matrix material. The reinforcement material serves as the load-bearing constituent of the CMC in the event of a matrix crack, while the ceramic matrix protects the reinforcement material, maintains the orientation of its fibers, and serves to dissipate loads to the reinforcement material. Of particular interest to high-temperature applications, such as in gas turbines, are silicon-based composites, which include silicon carbide (SiC) as the matrix and/or reinforcement material.

Different processing methods have been employed in forming CMCs. For example, one approach includes melt infiltration (MI), which employs a molten silicon to infiltrate into a fiber-containing perform. CMCs formed by MI are generally fully dense, e.g., having generally zero residual porosity. Another approach for forming CMCs is chemical vapor infiltration (CVI). CVI is a process whereby a matrix material is infiltrated into a fibrous preform by the use of reactive gases at elevated temperature to form the fiber-reinforced composite. Generally, limitations introduced by having reactants diffuse into the preform and by-product gases diffusing out of the perform result in relatively high residual porosity of between about 10 percent and about 15 percent in the composite. In particular, typically in forming CMCs using CVI, the outer portion of the composite formed by CVI typically has a lower porosity than the porosity of the inner portion of the composite. Another approach for forming CMCs includes initially employing a partial CVI process followed by a MI process. This approach usually yields lower residual porosity of between about 5 percent and about 7 percent.

There is a need for further ceramic matrix composites (CMC), and more particularly, to articles and methods for forming ceramic matrix composite articles having.

SUMMARY

The present disclosure provides, in a first aspect, a ceramic matrix composite article, which includes a melt infiltration ceramic matrix composite substrate comprising a ceramic fiber reinforcement material in a ceramic matrix material having a first free silicon proportion, and a melt infiltration ceramic matrix composite outer layer comprising a ceramic fiber reinforcement material in a ceramic matrix material having a second free silicon proportion disposed on an outer surface of at least a portion of the substrate, or a polymer impregnation and pyrolysis ceramic matrix composite outer layer comprising a ceramic fiber reinforcement material in a ceramic matrix material having a second free silicon proportion disposed on an outer surface of at least a portion of the substrate. The second free silicon proportion is less than the first free silicon proportion.

The present disclosure provides, in a second aspect, a method for forming a ceramic matrix composite article. The method includes forming a ceramic matrix composite substrate comprising a ceramic fiber reinforcement material in a ceramic matrix material having a first free silicon proportion by melt infiltration, forming a ceramic matrix composite outer layer comprising a ceramic fiber reinforcement material in a ceramic matrix material having a second free silicon proportion by melt infiltration or polymer impregnation and pyrolysis disposed on at least a portion of the substrate, and wherein the second free silicon proportion being less than the first free silicon proportion.

DRAWINGS

The foregoing and other features, aspects and advantages of this disclosure will become apparent from the following detailed description of the various aspects of the disclosure taken in conjunction with the accompanying drawings, wherein:

FIG. 1 is a cross-sectional view of a ceramic matrix composite article in accordance with aspects of the present disclosure having a ceramic matrix composite substrate and a ceramic matrix composite outer layer;

FIG. 2 cross-sectional view of the ceramic matrix composite substrate of the ceramic matrix composite article of FIG. 1;

Figure 8:
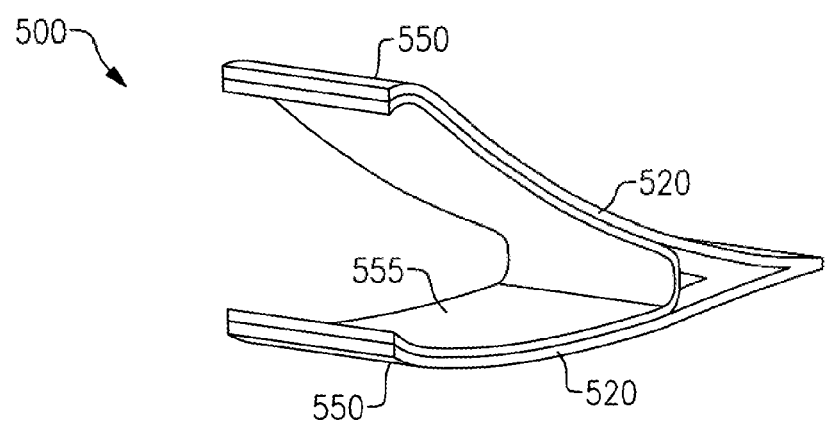
Figure 9:
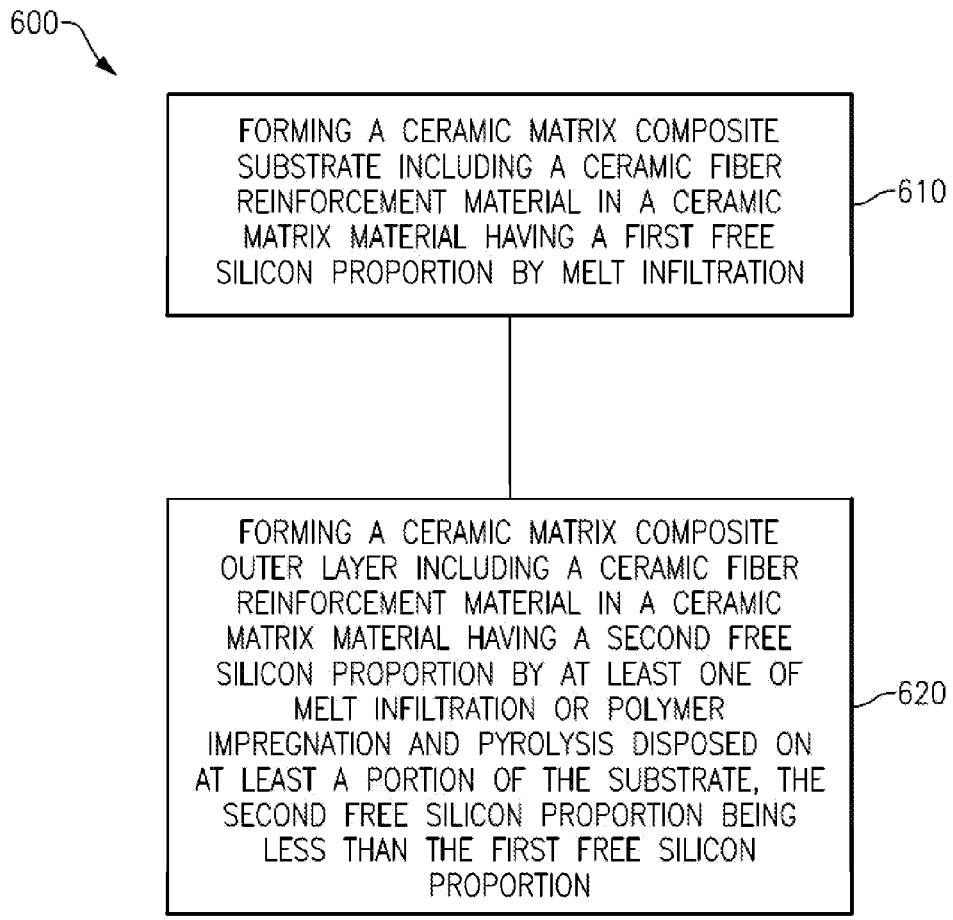

FIG. 8 is an exploded perspective view of a portion of a turbine nozzle in accordance with aspects of the present disclosure having a ceramic matrix composite substrate and a ceramic matrix composite outer layer; and FIG. 9 is a flowchart of a method for forming a CMC article having a ceramic matrix composite substrate and a ceramic matrix composite outer layer in accordance with aspects of the present disclosure.

DETAILED DESCRIPTION

The detailed description facilitates the explanation of certain aspects of the disclosure, and should not be interpreted as limiting the scope of the disclosure. Moreover, approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value. When introducing elements of various embodiments, the articles "a," "an," "the," and "said" are intended to mean that there are one or more of the elements. The terms "comprising," "including," and "having" are intended to be inclusive and mean that there may be additional elements other than the listed elements. As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances, the modified term may sometimes not be appropriate, capable, or suitable. Any examples of operating parameters are not exclusive of other parameters of the disclosed embodiments. Components, aspects, features, configurations, arrangements, uses and the like described, illustrated or otherwise disclosed herein with respect to any particular embodiment may similarly be applied to any other embodiment disclosed herein.

Generally, the present disclosure is directed to a ceramic matrix composite (CMC) articles having generally good mechanical properties such as tensile and/or compressive strength, along with increased creep resistance such as resistance to deformation or change in shape over time due to stress and/or increased temperature capability. For example, a CMC article may include a CMC substrate and an outer CMC skin or layer. The CMC substrate and the outer CMC skin or layer may have different properties allowing tailoring of the CMC article to result in a CMC article having generally good mechanical properties with increased creep resistance (resistance to deformation or change in shape over time due to stress) and/or increased temperature capability. The technique of the present disclosure results in both the CMC substrate and the CMC outer layer being CMCs having a reinforcing material, and thus both the CMC substrate and the CMC outer layer offering mechanical properties such as tensile and/or compressive strength. In addition, the CMC outer layer may also offer increased creep resistance and/or increased temperature capability to the CMC article. Such a technique of the present disclosure may be advantageous in CMC components where surface stresses are high and where creep is typically a problem, and/or where high temperatures are experienced. For example, many turbine components have thermal and mechanical stresses that simulate a bending condition. In bending, the in-plane stresses are highest at the surfaces. Thus, placing a more creep resistant material and temperature capability on the surface may improve the creep response and/or the thermal capability of the structure as a whole.

Figure 1:
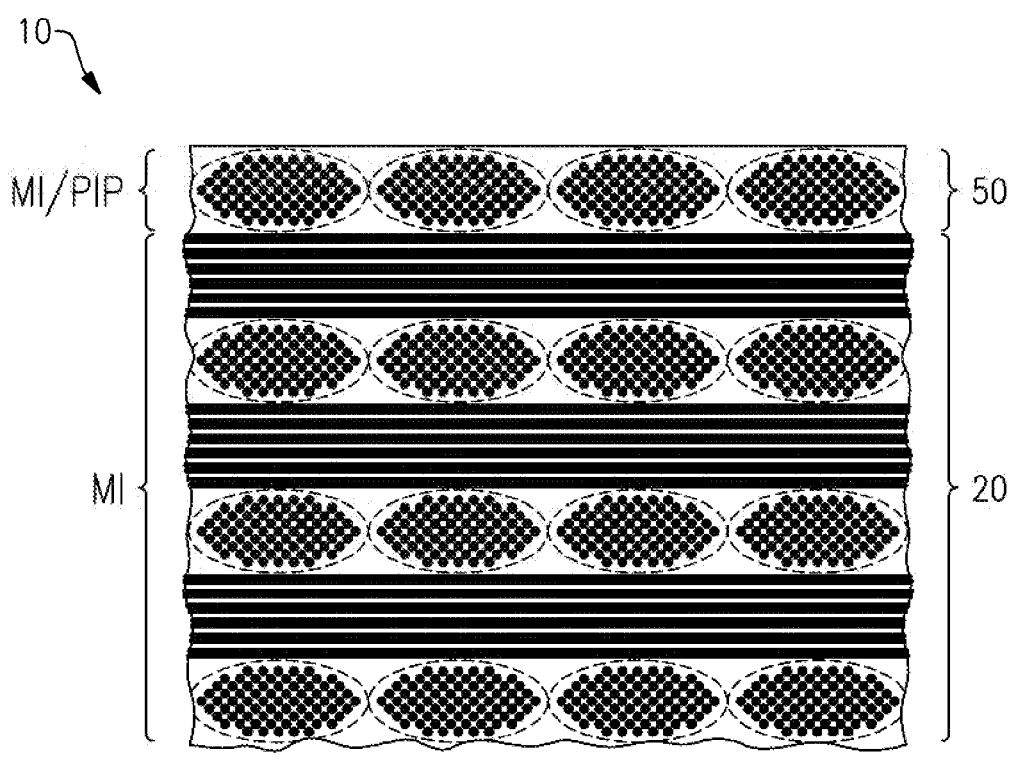

FIG. 1 illustrates a CMC article 10 having a CMC substrate 20 and a CMC skin or outer layer 50 in accordance with aspects of the present disclosure. As described in greater detail below, CMC substrate 20 may include a ceramic fiber reinforcement material in a ceramic matrix material having a first free silicon proportion or content (e.g., the amount of free silicon relative to the substrate as a whole), and CMC outer layer 50 may include a ceramic fiber reinforcement material in a ceramic matrix material disposed on an outer surface of at least a portion of the CMC substrate. CMC outer layer 50 may include a second free silicon proportion or content (e.g., the amount of free silicon relative to the outer layer as a whole) less than the first free silicon proportion of content. CMC substrate 20 may be a silicon rich silicon carbide substrate having, for example, free silicon (e.g., greater than 0 percent to about 30 percent, between 5 percent and about 30 percent, between about 5 percent and about 20 percent, between about 5 percent and about 15 percent, about or greater than 5 percent, about or greater than 10 percent, about or greater than 15 percent, about or greater than 20 percent, about or greater than 30 percent, or greater free silicon by volume of elemental silicon or silicon alloy phase). CMC substrate 20 may have generally full density, or none or little porosity (e.g., about 0 percent, less than 5 percent, or between about 0 percent and less than 5 percent).

CMC outer layer 50 may be generally less than about 10 percent, less than 10 percent, less than about 5 percent, or less than 5 percent by volume of elemental silicon or silicon alloy phase, pure silicon carbide (e.g., 0 percent), generally no or zero free silicon content silicon carbide (e.g., about 0 percent), or slightly carbon rich silicon carbide (e.g. a ratio of 0.995 silicon to 1.005 carbon). CMC outer layer 50 may have a porosity between about 5 percent to about 30 percent, between about 5 percent and about 10 percent, or about 10 percent to about 20 percent.

CMC substrate 20 may be formed by a first process and CMC outer layer 50 may be formed by a second process different from the first process. For example, the CMC substrate may be formed by using a melt infiltration process, and the outer layer may be formed using a melt infiltration process or a polymer impregnation and pyrolysis process. Outer layer 50 may have better creep resistance than substrate 20 and may result in CMC article 10 having a creep resistance greater than a creep resistance of a CMC article not having outer layer 50. CMC outer layer 50, which may have no free elemental silicon or silicon alloy, may have better temperature capabilities (e.g., higher than the melting point of silicon) compared to CMC substrate 20 (which may include free silicon) and may result in CMC article 10 having temperature capabilities greater than temperature capabilities of a CMC article not having outer layer 50.

Figure 2:
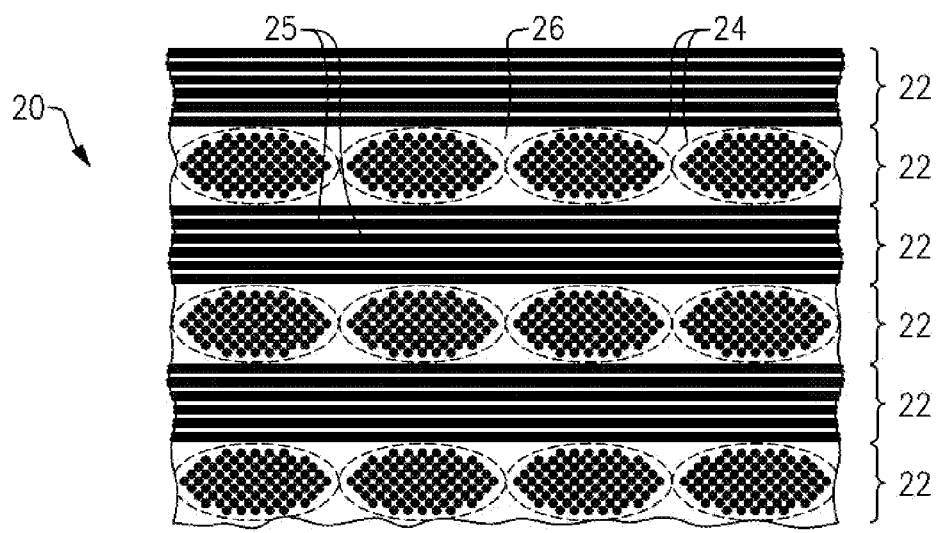

With reference to FIG. 2, CMC article 10 (FIG. 1) may include initially forming CMC substrate 20. A surface region of CMC substrate 20 may include multiple laminae 22, each derived from an individual prepreg that includes unidirectionally-aligned tows 24 of fibers 25 impregnated with a ceramic matrix precursor. As a result, each lamina 22 contains unidirectionally-aligned fibers 25 encased in a ceramic matrix 26 formed by conversion of the ceramic matrix precursor during firing and melt infiltration.

For example, CMC substrate 20 may be fabricated from multiple layers of "prepreg," often in the form of a tape-like structure, comprising the reinforcement material of the desired CMC impregnated with a precursor of the CMC matrix material. The prepreg may undergo processing (including firing) to convert the precursor to the desired ceramic. The prepregs may be continuous fiber reinforced ceramic composite (CFCC) materials and may include a two-dimensional fiber array comprising a single layer of unidirectionally-aligned tows impregnated with a matrix precursor to create a generally two-dimensional laminate. Multiple plies of the resulting prepregs are stacked and debulked to form a laminate preform, a process referred to as "lay-up." The prepregs may be arranged so that tows of the prepreg layers are oriented transverse (e.g., perpendicular) or at an angle to each other, providing greater strength in the laminar plane of the preform (corresponding to the principal (load-bearing) directions of the final CMC component).

Following lay-up, the laminate preform may undergo debulking and curing while subjected to applied pressure and an elevated temperature, such as in an autoclave. In the case of melt-infiltrated (MI), the debulked and cured preform undergoes additional processing. First, the preform may be heated in vacuum or in an inert atmosphere in order to decompose the organic binders, at least one of which pyrolyzes during this heat treatment to form a carbon char, and produces a porous preform for melt infiltration. Further heating, either as part of the same heat cycle as the binder burn-out step or in an independent subsequent heating step, the preform is melt infiltrated, such as with molten silicon supplied externally. The molten silicon infiltrates into the porosity, reacts with the carbon constituent of the matrix to form silicon carbide, and fills the porosity to yield the desired CMC substrate.

Figure 3:
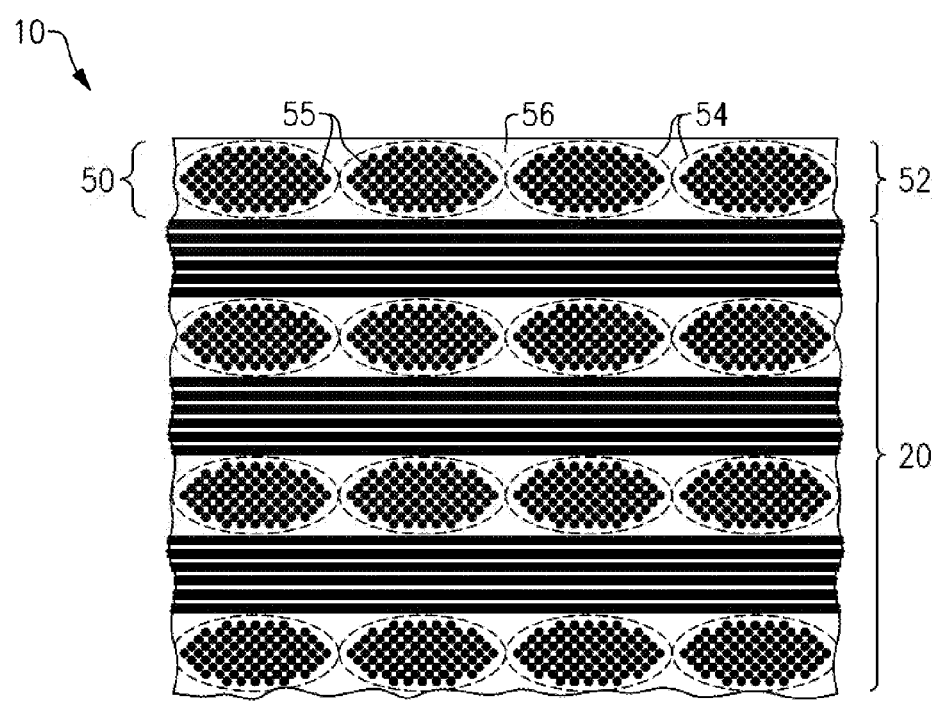
FIG. 3 is a cross-sectional view of the ceramic matrix composite substrate of FIG. 2 with the ceramic matrix composite outer layer.

With reference to FIG. 3, CMC article 10 may include forming outer layer 50 on initially formed CMC substrate 20. For example, a lamina 52 may be derived from an individual prepreg that includes unidirectionally-aligned tows 54 impregnated with a ceramic matrix precursor. Lamina 52 contains unidirectionally-aligned fibers 55 encased in a ceramic matrix 56 formed by conversion of the ceramic matrix precursor during firing and melt infiltration (MI).

For example, CMC outer layer 50 may be fabricated from a layer of "prepreg," often in the form of a tape-like structure, comprising the reinforcement material of the desired CMC impregnated with a precursor of the CMC matrix material. The prepreg undergoes processing (including firing) to convert the precursor to the desired ceramic. The prepreg may be continuous fiber reinforced ceramic composite (CFCC) materials and may include a two-dimensional fiber array comprising a single layer of unidirectionally-aligned tows impregnated with a matrix precursor to create a generally two-dimensional laminate. A ply of the prepreg may be disposed on CMC substrate. The prepreg may be arranged so that tows of the prepreg layer are oriented transverse (e.g., perpendicular) or at an angle to the tows of the outermost layer of the CMC substrate.

The prepreg layer may undergo curing while subjected to applied pressure and an elevated temperature, such as in an autoclave or localized application of pressure and heat. In the case of melt infiltration, the prepreg layer disposed on the CMC substrate may be heated in vacuum or in an inert atmosphere in order to decompose the organic binders, at least one of which pyrolyzes during this heat treatment to form a carbon char, and produces a porous layer for melt infiltration. Further heating, either as part of the same heat cycle as the binder burn-out step or in an independent subsequent heating step, the layer is melt infiltrated, such as with molten silicon supplied externally. The molten silicon infiltrates into the porosity, reacts with the carbon constituent of the matrix to form silicon carbide, and fills the porosity to yield the desired CMC outer layer.

For forming CMC outer layer 50, a melt infiltration process may be the same or different compared to the melt infiltration process employed in forming CMC substrate 20. For example, employing the same melt infiltration process as applied to the substrate to the relatively thin outer later layer may result in outer layer 50 having a second free silicon content less than the first free silicon content of the substrate. Alternatively, the melt infiltration process may be tailored (e.g., reducing the time that the outer layer is disposed in the silicon bath compared to the forming of the substrate) so that the outer layer results in outer layer 50 having a second free silicon content less than the first free silicon content of the substrate.

In another embodiment, the CMC substrate and the CMC outer layer may be formed at the same time or at different times employing melt infiltration. For example, the prepregs for forming the substrate and outer layer may be different. The prepreg for the outer layer may be made with a prepreg that after melt infiltration consumes more of the free silicon resulting the outer layer having less free silicon compared to the free silicon content of the substrate. Such prepregs for the substrate may include carbon, and such prepregs for the outer layer may include additional reactive metals such as molybdenum or tantalum.

In another embodiment, the CMC substrate and the CMC outer layer may be formed at the same time employing a melt infiltration process. For example, after a melt infiltration process, a free silicon extraction process may be employed to remove the free silicon from the outermost layer or layers to define an outer layer having less free silicon content and greater porosity compared to the free silicon content and porosity of the substrate.

With reference again to FIG. 3, in another embodiment in accordance with the present disclosure, the substrate may be formed by melt infiltration, and CMC outer layer 50 may be formed by a polymer impregnation and pyrolysis (PIP) process. For example, a PIP process may include soaking the fiber perform with a liquid polymeric precursor, which is first cured (cross-linked) and later pyrolyzed, converting the polymer into ceramic. Selection of the specific fiber perform and liquid polymeric precursor may results in outer layer 50 having a free silicon content that is less than the free silicon content of the substrate.

Figure 4:
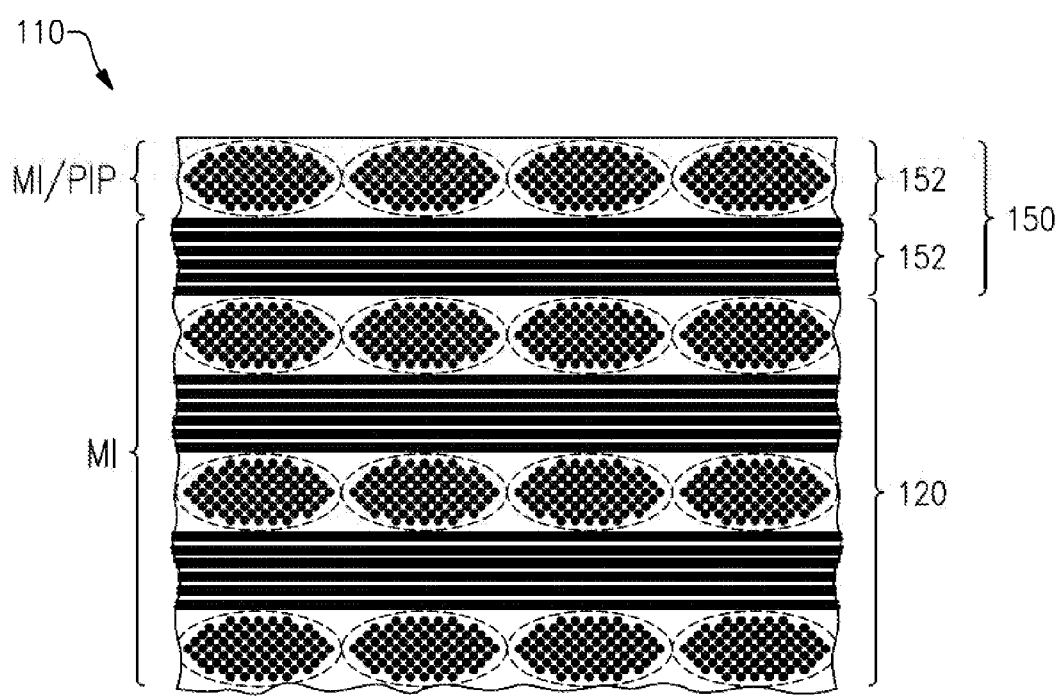
FIG. 4 is a cross-sectional view of a CMC article in accordance with aspects of the present disclosure having a ceramic matrix composite substrate and a ceramic matrix composite outer layer.

FIG. 4 illustrates a CMC article 110 having a CMC substrate 120 and a CMC skin or outer layer 150 in accordance with aspects of the present disclosure. CMC substrate 120 may include a ceramic fiber reinforcement material in a ceramic matrix material having a first free silicon proportion or content, and CMC outer layer 150 may include a ceramic fiber reinforcement material in a ceramic matrix material disposed on an outer surface of at least a portion of the CMC substrate. CMC outer layer 150 may include a second free silicon proportion or content less than the first free silicon proportion or content. CMC substrate 120 may be a silicon rich silicon carbide substrate having, for example, free silicon (e.g., greater than 0 percent to about 30 percent, between 5 percent and about 30 percent, between about 5 percent and about 20 percent, between about 5 percent and about 15 percent, about or greater than 5 percent, about or greater than 10 percent, about or greater than 15 percent, about or greater than 20 percent, about or greater than 30 percent, or greater free silicon by volume of elemental silicon or silicon alloy phase). For example, CMC substrate 120 may have generally full density, or none or little porosity (e.g., about 0 percent, less than 5 percent, or between about 0 and less than 5 percent).

CMC outer layer 150 may be generally less than about 10 percent, less than 10 percent, less than about 5 percent, or less than 5 percent by volume of elemental silicon or silicon alloy phase, pure silicon carbide (e.g., 0 percent), generally no or zero free silicon content silicon carbide (e.g., about 0 percent), or slightly carbon rich silicon carbide (e.g. a ratio of 0.995 silicon to 1.005 carbon). CMC outer layer 150 may have a porosity between about 5 percent to about 30 percent, between about 5 percent and about 10 percent, or about 10 percent to about 20 percent.

CMC substrate 120 may be formed by a first process and CMC outer layer 150 may be formed by a second process different from the first process. For example, the CMC substrate may be formed by formed using a melt infiltration process, and the outer layer be formed using a melt infiltration process or a polymer impregnation and pyrolysis process. Outer layer 150 having better creep resistance than substrate 120 may result in CMC article 110 having a creep resistance greater than a creep resistance of a CMC article not having outer layer 150. CMC outer layer 150, which may have no free elemental silicon or silicon alloy, may have better temperature capabilities (e.g., higher than the melting point of silicon) compared to CMC substrate 120 (which may include free silicon) and may result in CMC article 110 having temperature capabilities greater than temperature capabilities of a CMC article not having outer layer 150.

CMC article 110 may include initially forming CMC substrate 120 in a similar manner as noted above in connection with forming substrate 20 (FIG. 2). With reference still to FIG. 4, CMC article 110 may include forming outer layer 150 on initially formed CMC substrate 120. For example, outer layer 150 may include a plurality of laminae 152, each derived from an individual prepreg that includes unidirectionally-aligned tows impregnated with a ceramic matrix precursor. Each lamina 152 may contain unidirectionally-aligned fibers encased in a ceramic matrix formed by conversion of the ceramic matrix precursor during firing.

For example, CMC outer layer 150 may be fabricated from a plurality of layers of "prepreg," often in the form of a tape-like structure, comprising the reinforcement material of the desired CMC impregnated with a precursor of the CMC matrix material. The prepreg undergoes processing (including firing) to convert the precursor to the desired ceramic. The prepregs may be continuous fiber reinforced ceramic composite (CFCC) materials and may include a two-dimensional fiber array comprising a single layer of unidirectionally-aligned tows impregnated with a matrix precursor to create a generally two-dimensional laminate. The plurality of plies of the resulting prepregs are stacked and debulked. The prepregs are typically arranged so that tows of the prepreg layers are oriented transverse (e.g., perpendicular) to each other or at an angle to the tows of the outermost layer of the CMC substrate.

The plurality of layers may typically undergo debulking and curing while subjected to applied pressure and an elevated temperature, such as in an autoclave or localized application of pressure and heat. In the case of melt infiltration, the debulked and cured plurality of layers disposed on the CMC substrate may be heated in vacuum or in an inert atmosphere in order to decompose the organic binders, at least one of which pyrolyzes during this heat treatment to form a carbon char, and produces a porous layer for melt infiltration. Further heating, either as part of the same heat cycle as the binder burn-out step or in an independent subsequent heating step, the porous layer is melt infiltrated, such as with molten silicon supplied externally. The molten silicon infiltrates into the porosity, reacts with the carbon constituent of the matrix to form silicon carbide, and fills the porosity to yield the desired CMC outer layer.

For forming CMC outer layer 150, a melt infiltration process may be the same or different compared to the melt infiltration process employed in forming CMC substrate 120. For example, employing the same melt infiltration process as applied to the substrate to the outer later layer may result in outer layer 150 having a second free silicon content less than the first free silicon content of the substrate. Alternatively, the melt infiltration process may be tailored (e.g., reducing the time of that the outer layer is disposed in the silicon bath compared to the forming of the substrate) so that the outer layer results in outer layer 150 having a second free silicon content is less than the first free silicon content of the substrate.

In another embodiment, the CMC substrate and the CMC outer layer may be formed at the same time or at different times employing melt infiltration. For example, the prepregs for forming the substrate and outer layer may be different. The prepreg for the outer layer may be made with a prepreg that after melt infiltration consumes more of the free silicon resulting the outer layer having less free silicon compared to the free silicon content of the substrate. Such prepregs for the substrate may include carbon, and such prepregs for the outer layer may include additional reactive metals such as molybdenum or tantalum.

In another embodiment, the CMC substrate and the CMC outer layer may be formed at the same time employing a melt infiltration process. For example, after a melt infiltration process, a free silicon extraction process may be employed to remove the free silicon from the outermost layer or layers to define an outer layer having less free silicon content and greater porosity compared to the free silicon content and porosity of the substrate.

With reference still to FIG. 4, in another embodiment in accordance with the present disclosure, the substrate may be formed by melt infiltration, and CMC outer layer 150 may be formed by a polymer impregnation and pyrolysis (PIP) process. For example, a PIP process may include soaking the fiber perform with a liquid polymeric precursor, which is first cured (cross-linked) and later pyrolyzed, converting the polymer into ceramic. Selection of the specific fiber perform and liquid polymeric precursor may results in outer layer 150 having a free silicon content that is less than the free silicon content of the substrate.

In the above embodiments, a material for the tows may be SiC fibers. An example of a material suitable for the tows is HI-NICALON® from Nippon Carbon Co., Ltd. A suitable range for the diameters of the fibers is about two to about twenty micrometers, though fibers with larger and smaller diameters are also within the scope of this disclosure. The fibers may be preferably coated with materials to impart certain desired properties to the CMC substrate and/or CMC outer layer, such as a carbon or boron nitride interface layer (not shown). Those skilled in the art will appreciate that the teachings of this disclosure are also applicable to other CMC material combinations, and that such combinations are within the scope of this disclosure.

As described above, the CMC outer layer formed by a melt infiltration or a polymer impregnation and pyrolysis-process having little or no free silicon phase may result in the CMC outer layer having greater creep resistance and/or temperature capability than the CMC substrate formed by MI and having generally full density, or none or little porosity such as about 0 percent, less than 5 percent, or between about 0 and less than 5 percent. In addition, the CMC substrate such as formed by a silicon melt infiltration may result in a silicon rich silicon carbide substrate having, for example, 5 percent, 10 percent, 15 percent, 20 percent, 30 percent, or greater free silicon by volume of elemental silicon or silicon alloy phase. The CMC outer layer may be generally less than 5 percent by volume of elemental silicon or silicon alloy phase, pure silicon carbide, e.g., about 1 to 1 ratio of silicon to carbon, or slightly carbon rich such as a ratio of 0.995 silicon to 1.005 carbon. The CMC outer layer may have a porosity of between about 5 percent to about 30, between about 5 percent and about 10 percent, or between about 10 percent to about 20 percent. The thickness of the plies or unidirectional tape for forming the CMC article may be about 5 mils (0.005 inch) to about 10 mils (0.010 inch). The CMC article may be formed having a single ply or layer of reinforcement fibers, a plurality of plies or layers of reinforcement fibers, or multiple plies or layers of reinforcement fibers for forming the CMC outer layer. For example, the CMC article of the present disclosure may comprise a CMC substrate formed from about eight plies or layers of reinforcement fibers and melt infiltration, and an outer layer formed from one or two plies or layers of reinforcement fibers so that the outer layer may be about 10 percent to about 25 percent of the thickness of the CMC article. In other embodiments of the ceramic matrix composite article, the outer layer may be about 10 percent to about 50 percent of the thickness of the ceramic matrix composite article. In other embodiments, the CMC article may have about 50 to about 100 plies. It will be appreciated that other configurations of the number of plies and thickness of the CMC substrate relative to the CMC outer layer are also possible.

While the CMC article may be formed from unidirectional prepreg tapes, it will be appreciated that woven prepreg tape may be employed to form the CMC substrate and/or the CMC outer layer. The aligned fibers in the unidirectional prepreg tape may result in fewer pores than that resulting from a prepreg woven fiber fabric. In addition, one or more additional layers or coatings may be formed on the CMC outer layer of the CMC article. For example, in some embodiments, an environmental barrier coating (EBC) system may be formed on the outer layer.

In addition, the substrate and/or the outer layer may be formed by a slurry cast melt infiltration process, for example, employing a slurry of carbon, carbon-containing resin, or other carbonaceous material, and, optionally, silicon carbide particulate, which is introduced into the porosity of a fibrous perform, and molten silicon is thereafter infiltrated into the remaining space to react with the carbonaceous material to form silicon carbide. The fibrous perform may be formed from a woven material.

Figure 5:
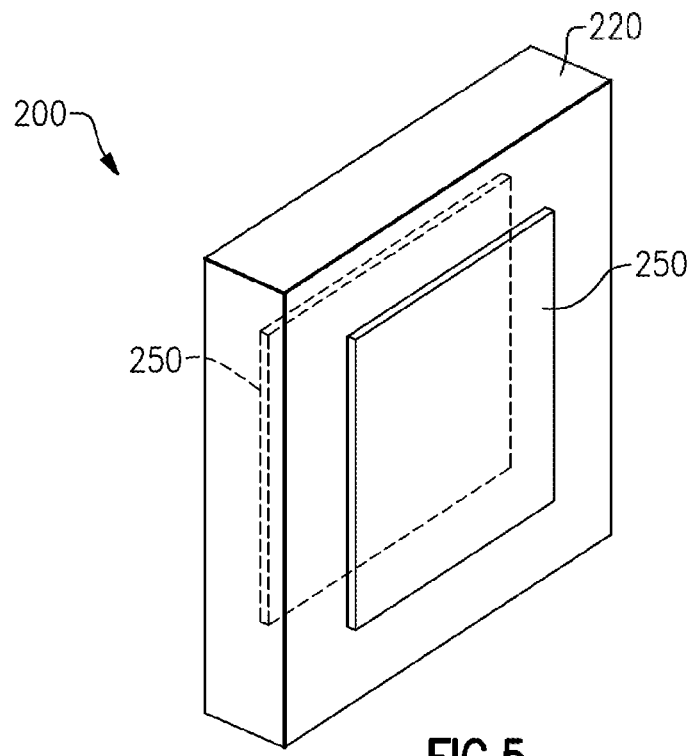
FIG. 5 is a perspective view of a CMC article in accordance with aspects of the present disclosure having a ceramic matrix composite substrate and a ceramic matrix composite outer layer.

FIG. 5 illustrates a CMC article 210 having a ceramic matrix composite substrate 220 and opposite ceramic matrix composite outer layers 250 in accordance with aspects of the present disclosure. CMC outer layer 250 may extend over the entire CMC substrate or only over a portion of CMC substrate 220 such as on one side and on both sides of a substrate. Substrate 220 and outer layer 250 may be similarly formed and have the characteristics of substrate 20 (FIG. 3) and 120 (FIG. 4), and outer layer 50 (FIG. 3) and 150 (FIG. 4) as described above.

Figure 6:
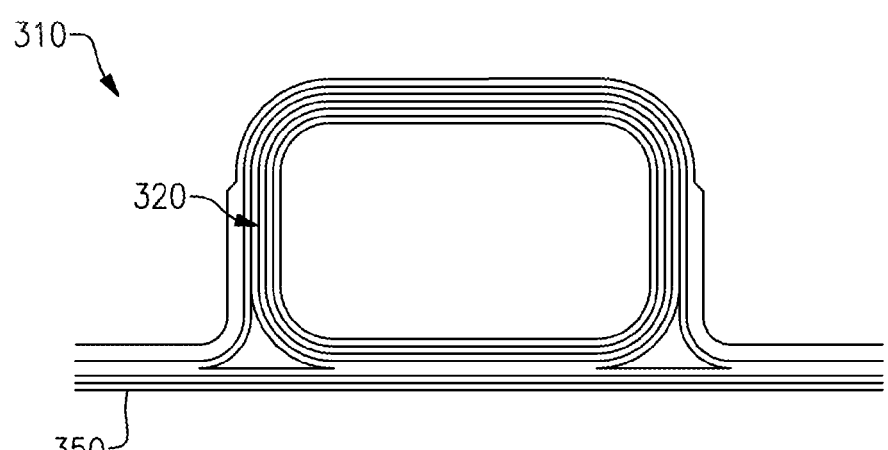
FIG. 6 is a cross-sectional view of a portion of a CMC turbine shroud in accordance with aspects of the present disclosure having a ceramic matrix composite substrate and a ceramic matrix composite outer layer.

FIG. 6 is a cross-sectional view of a portion of a CMC turbine shroud 310 having a ceramic matrix composite substrate 320 and a ceramic matrix composite outer layer 350 in accordance with aspects of the present disclosure. For example, outer layer 350 is disposed adjacent to hot flow gas of a turbine. Substrate 320 and outer layer 350 may be similarly formed and have the characteristics of substrate 20 (FIG. 3) and 120 (FIG. 4), and outer layer 50 (FIG. 3) and 150 (FIG. 4) as described above.

Figure 7:
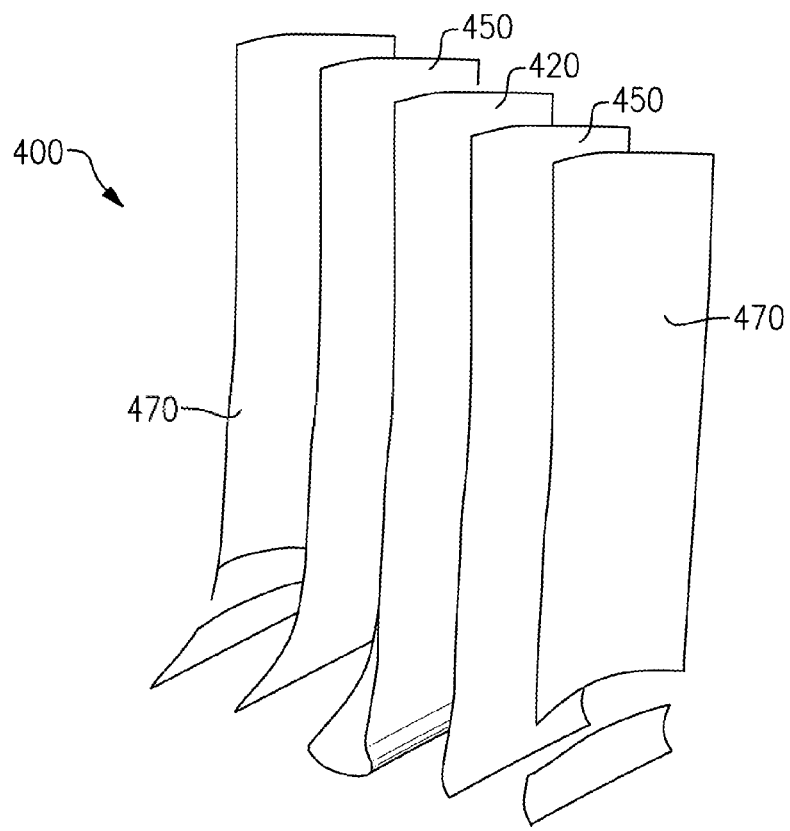
FIG. 7 is an exploded perspective view of a turbine blade in accordance with aspects of the present disclosure having a ceramic matrix composite substrate and a ceramic matrix composite outer layer.

FIG. 7 is an exploded perspective view of a turbine blade 400 having a ceramic matrix composite substrate 420, a ceramic matrix composite outer layer 450, and an environmental barrier layer system 470 in accordance with aspects of the present disclosure generally. Substrate 420 and outer layer 450 may be similarly formed and have the characteristics of substrate 20 (FIG. 3) and 120 (FIG. 4), and outer layer 50 (FIG. 3) and 150 (FIG. 4) as described above.

FIG. 8 is a perspective view of a portion of a turbine nozzle 500 having a ceramic matrix composite substrate 520, a first ceramic matrix composite outer layer 550, and a second ceramic matrix composite outer layer 555 in accordance with aspects of the present disclosure generally. The first outer layer 450 may wrap around the trailing edge of the nozzle. Substrate 520 and outer layer 550 may be similarly formed and have the characteristics of substrate 20 (FIG. 3) and 120 (FIG. 4), and outer layer 50 (FIG. 3) and 150 (FIG. 4) as described above.

As noted above, generally CMC articles formed solely using uniform performs and melt infiltration have attractive features including a full density and mechanical properties. However, due to free silicon resulting from melt infiltration, at temperatures over about 2,400 degrees Fahrenheit (about 1,300 degrees Celsius), the creep resistance of the matrix is poor which manifests itself in poor creep rupture and Sustained Peak Low Cycle Fatigue (SPLCF) strengths. At temperatures over about 2,550 degrees Fahrenheit (about 1,400 degrees Celsius), the free silicon melts. CMC articles formed solely using chemical vapor infiltration contain significant porosity which leads to poor inter-laminar properties and poor oxidation resistance.

From the present description, it will be appreciated that the techniques of the present disclosure overcome the problems associated with CMC articles formed solely from a uniform perform using melt infiltration or by chemical vapor infiltration by providing a CMC skin or outer layer that offer increased creep resistance and/or increased temperature capability to the CMC article. The proposed technique of the present disclosure may increase the temperature limit of current MI ceramic matrix composites from about 2,400 degrees Fahrenheit (about 1,300 degrees Celsius) to temperatures above the melting temperature of silicon, approximately 2,577 degrees Fahrenheit (approximately 1,414 degrees Celsius). For example, present technique may offer the potential to increase the temperature capability of CMC composites by between about 200 degrees Fahrenheit (about 90 degrees Celsius) and about 300 degrees Fahrenheit (about 150 degrees Celsius). This may be possible where the article is used in a thermal gradient where the substrate is maintained below about 2500 degrees Fahrenheit (about 1,370 degrees Celsius) but the outer surface is allowed to exceed this temperature, such as in a turbine shroud. This temperature capability may lead to reduction in Specific Fuel Consumption (SFC) of several percent for aircraft engines, and thus, reduction in fuel and expenses for the airlines.

Such a technique of the present disclosure may be advantageous for application to ceramic or silicon-bearing turbine components, for example, turbine blades, vanes, nozzles, shrouds, etc.

FIG. 9 illustrates a method 600 for forming a ceramic matrix composite article. The method includes, at 610, forming a ceramic matrix composite substrate comprising a ceramic fiber reinforcement material in a ceramic matrix material having a first free silicon proportion by melt infiltration, and at 620, forming a ceramic matrix composite outer layer comprising a ceramic fiber reinforcement material in a ceramic matrix material having a second free silicon proportion by melt infiltration or polymer impregnation and pyrolysis disposed on at least a portion of the substrate. The second free silicon proportion being less than the first free silicon proportion.

In other embodiments of the present disclosure, a ceramic matrix composite article may include a ceramic matrix composite substrate comprising a ceramic fiber reinforcement material in a ceramic matrix material having a first free silicon proportion, a ceramic matrix composite outer layer comprising a ceramic fiber reinforcement material in a ceramic matrix material having a second free silicon proportion disposed on an outer surface of at least a portion of the substrate, and the second free silicon proportion being less than the first free silicon proportion.

In other embodiments of the present disclosure ceramic matrix composite article may include a ceramic matrix composite substrate comprising ceramic fiber reinforcement material in a ceramic matrix material having a first porosity, and a ceramic matrix composite outer layer comprising ceramic fiber reinforcement material in a ceramic matrix material having a second porosity disposed on at least a portion of the substrate. The second porosity is greater than the first porosity.

In other embodiments of the present disclosure ceramic matrix composite article may include a ceramic matrix composite substrate comprising ceramic fiber reinforcement material in a ceramic matrix material having a first creep resistance, and a ceramic matrix composite outer layer comprising ceramic fiber reinforcement material in a ceramic matrix material having a second creep resistance disposed on at least a portion of the substrate. The second creep resistance is greater than the first creep resistance.

It is to be understood that the above description is intended to be illustrative, and not restrictive. Numerous changes and modifications may be made herein by one of ordinary skill in the art without departing from the general spirit and scope of the disclosure as defined by the following claims and the equivalents thereof. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Also, the term "operably" in conjunction with terms such as coupled, connected, joined, sealed or the like is used herein to refer to both connections resulting from separate, distinct components being directly or indirectly coupled and components being integrally formed (i.e., one-piece, integral or monolithic). Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure. It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the disclosure has been described in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments have been described, it is to be understood that aspects of the disclosure may include only some of the described embodiments. Accordingly, the disclosure is not to be seen as limited by the foregoing description, but is only limited by the scope of the appended claims.

This written description uses examples, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A method for forming a ceramic matrix composite article, the method comprising:
    forming a ceramic matrix composite substrate comprising a ceramic fiber reinforcement material in a ceramic matrix material having a first free silicon proportion by melt infiltration;
    forming a ceramic matrix composite outer layer comprising a ceramic fiber reinforcement material in a ceramic matrix material having a second free silicon proportion by melt infiltration or polymer impregnation 4-pyrolysis disposed on at least a portion of the substrate; and
    wherein the second free silicon proportion being less than the first free silicon proportion.

2. The method of claim 1 wherein the substrate comprises generally silicon carbide and free silicon, and the outer layer comprises generally pure silicon carbide.

3. The method of claim 1 wherein the substrate comprises generally silicon carbide and free silicon, and the outer layer comprises generally silicon carbide and free carbon.

4. The method of claim 1 wherein the substrate comprises between 5 percent and about 30 percent free silicon, and the outer layer comprises less than 5 percent free silicon.

5. The method of claim 1 wherein the substrate comprises between about 5 percent and about 15 percent free silicon, and the outer layer comprises about 0 percent free silicon.

6. The method of claim 1 wherein the substrate comprises a first porosity, the outer layer comprises a second porosity, and the second porosity being greater than the first porosity.

7. The method of claim 6 wherein the substrate comprises less than 5 percent porosity, and the outer layer comprises a porosity of 5 percent to 30 percent.

8. The method of claim 6 wherein the substrate comprises generally no porosity, and the outer layer comprises a porosity of about 5 percent to about 10 percent.

9. The method of claim 1 wherein the substrate comprises between 5 percent and about 30 percent free silicon and generally no porosity, and the outer layer comprises less than 5 percent free silicon and a porosity between about 5 percent to about 30 percent.

10. The method of claim 1 wherein the substrate comprises between 5 percent and about 15 percent free silicon and generally no porosity, and the outer layer comprises about 0 percent free silicon and a porosity generally between about 5 percent and less than about 10 percent.

11. The method of claim 1 wherein the forming the outer layer comprises forming the outer layer by polymer impregnation pyrolysis.

12. The method of claim 1 wherein the forming the outer layer comprises forming the outer layer by melt infiltration after forming of the substrate by melt infiltration.

13. The method of claim 1 wherein the forming outer layer comprises forming the substrate and the outer layer by melt infiltration at the same time, and further comprising extracting free silicon from the outer layer.

14. The method of claim 1 wherein the forming the substrate comprises laying up a first prepreg, the forming the outer layer comprises laying up a second prepreg, and the forming the substrate and forming the outer layer comprises melt infiltration of the first prepreg and the second prepreg at the same time.

15. The method of claim 1 wherein the ceramic fiber reinforcement material of the substrate is the same as the ceramic fiber reinforcement material of the outer layer.

* * * * *